United States Patent
Cho

(10) Patent No.: US 12,424,267 B2
(45) Date of Patent: Sep. 23, 2025

(54) STORAGE DEVICE AND OPERATING METHOD THEREOF

(71) Applicant: SK hynix Inc., Gyeonggi-do (KR)

(72) Inventor: Sung Yeob Cho, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 211 days.

(21) Appl. No.: 18/325,109

(22) Filed: May 30, 2023

(65) Prior Publication Data

US 2024/0194245 A1  Jun. 13, 2024

(30) Foreign Application Priority Data

Dec. 8, 2022 (KR) .................. 10-2022-0170376

(51) Int. Cl.
*G11C 11/40* (2006.01)
*G01R 31/52* (2020.01)
*G11C 7/04* (2006.01)
*G11C 11/4078* (2006.01)

(52) U.S. Cl.
CPC .......... *G11C 11/4078* (2013.01); *G01R 31/52* (2020.01); *G11C 7/04* (2013.01)

(58) Field of Classification Search
CPC ....... G11C 11/4078; G11C 7/04; G01R 31/52; G06F 1/3275; G06F 1/206; G06F 3/0653; G06F 11/3062; Y02D 10/00
See application file for complete search history.

(56) References Cited

U.S. PATENT DOCUMENTS

| 10,908,659 | B2 | 2/2021 | Kuwano et al. |
| 2014/0022002 | A1* | 1/2014 | Chua-Eoan ............ G06F 1/206 |
| | | | 327/512 |
| 2017/0003339 | A1* | 1/2017 | Zhao .................. G01R 31/3012 |
| 2020/0073592 | A1 | 3/2020 | Nishikawa et al. |
| 2023/0054139 | A1* | 2/2023 | Cai .......................... G11C 8/16 |

FOREIGN PATENT DOCUMENTS

KR  10-2020-0126533 A  11/2020

* cited by examiner

*Primary Examiner* — Mohammed A Bashar

(74) *Attorney, Agent, or Firm* — IP & T GROUP LLP

(57) ABSTRACT

A storage device is provided which is capable of preventing characteristic degradation of the storage device at low temperature and reducing a failure. The storage device includes a memory device; a leakage current information storage for storing information associated with a leakage current generated based on a temperature range of the memory device; and a current controller for controlling the current internally consumed, based on the information associated with the leakage current, when a current temperature of the memory device is equal to or lower than a first temperature.

18 Claims, 9 Drawing Sheets

FIG. 3A

| TEMPERATURE | PROCESS CORNER | LEAKAGE CURRENT |
|---|---|---|
| TEMPERATURE A | FF | LEAK_CURRENT 1 |
| | TT | LEAK_CURRENT 2 |
| | SS | LEAK_CURRENT 3 |
| TEMPERATURE B | FF | LEAK_CURRENT 4 |
| | TT | LEAK_CURRENT 5 |
| | SS | LEAK_CURRENT 6 |
| TEMPERATURE C | FF | LEAK_CURRENT 7 |
| | TT | LEAK_CURRENT 8 |
| | SS | LEAK_CURRENT 9 |

310

* TEMPERATURE A > TEMPERATURE B > TEMPERATURE C

FIG. 3B

| MAXIMUM ALLOWANCE OF LEAKAGE CURRENT | LEAK_CURRENT_MAX |
|---|---|
| LEAKAGE CURRENT MARGIN RANGE (R) | 0 < R ≤ LEAK_CURRENT_HIGH − LEAK_CURRENT_LOW (if, LEAK_CURRENT_HIGH < LEAK_CURRENT MAX) |
| | 0 < R ≤ LEAK_CURRENT_MAX − LEAK_CURRENT_LOW (if, LEAK_CURRENT_HIGH ≥ LEAK_CURRENT MAX) |

320

STORAGE DEVICE AND OPERATING METHOD THEREOF

CROSS-REFERENCE TO RELATED APPLICATION

The present application claims priority under 35 U.S.C. § 119(a) to Korean Patent Application No. 10-2022-0170376 filed on Dec. 8, 2022, the entire disclosure of which is incorporated by reference herein.

BACKGROUND

1. Field of Invention

Various embodiments of the present disclosure generally relate to an electronic device, and more particularly, to a storage device and an operating method thereof.

2. Description of Related Art

A storage device is a device which stores data under the control of a host device such as a computer or a smart phone. The storage device may include a memory device for storing data and a memory controller for controlling operations of the memory device. The memory device may be a volatile memory device or a nonvolatile memory device.

The volatile memory device may keep data stored therein only when power is supplied, and may lose the stored data when the supply of power is interrupted. The volatile memory device may include a Static Random Access Memory (SRAM), a Dynamic Random Access Memory (DRAM), or the like.

The nonvolatile memory device may keep even when the supply of power is interrupted. The nonvolatile memory device may include a Read Only Memory (ROM), a Programmable ROM (PROM), an Electrically Programmable ROM (EPROM), an Electrically Erasable ROM (EEROM), a flash memory, or the like.

SUMMARY

Embodiments of the present disclosure are directed to provide a storage device and an operating method thereof, which can prevent characteristic degradation of the storage device at a low temperature and reduce a failure.

In accordance with an aspect of the present disclosure, there is provided a storage device including: a memory device; a leakage current information storage configured to store information associated with a leakage current generated based on a temperature range of the memory device; and a current controller configured to control a current internally consumed, based on the information associated with the leakage current, when a current temperature of the memory device is equal to or lower than a first temperature.

In accordance with another aspect of the present disclosure, there is provided a method of operating a storage device including a memory controller and a memory device, the method including: measuring, by the memory controller, a temperature of the memory device; determining, by the memory controller, a leakage current margin range based on an amount of a leakage current for each temperature range of the memory device; and allowing, by the memory controller, a current to be internally consumed within the leakage current margin range.

In accordance with still another aspect of the present disclosure, there is provided a storage device including: a memory device; a current consuming component configured to generate heat by consuming a current; and a current controller configured to control the current flowing in the current consuming component until a current temperature of the memory device reaches a predetermined target temperature by the generated heat, when the current temperature is equal to or lower than a first temperature.

In accordance with still another aspect of the present disclosure, there is provided a storage device including: a memory device; and a memory controller configured to perform, when a current temperature is less than a reference temperature, a heat-generating operation until the current temperature of the memory device reaches a target temperature.

The heat-generating operation may be performed within a leakage current margin range which is determined based on a temperature and a process characteristic of the memory device.

BRIEF DESCRIPTION OF THE DRAWINGS

Embodiments of the present disclosure will now be described more fully hereinafter with reference to the accompanying drawings; however, the embodiments may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 3A and 3B are diagrams for describing information associated with a leakage current in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Figure 1:
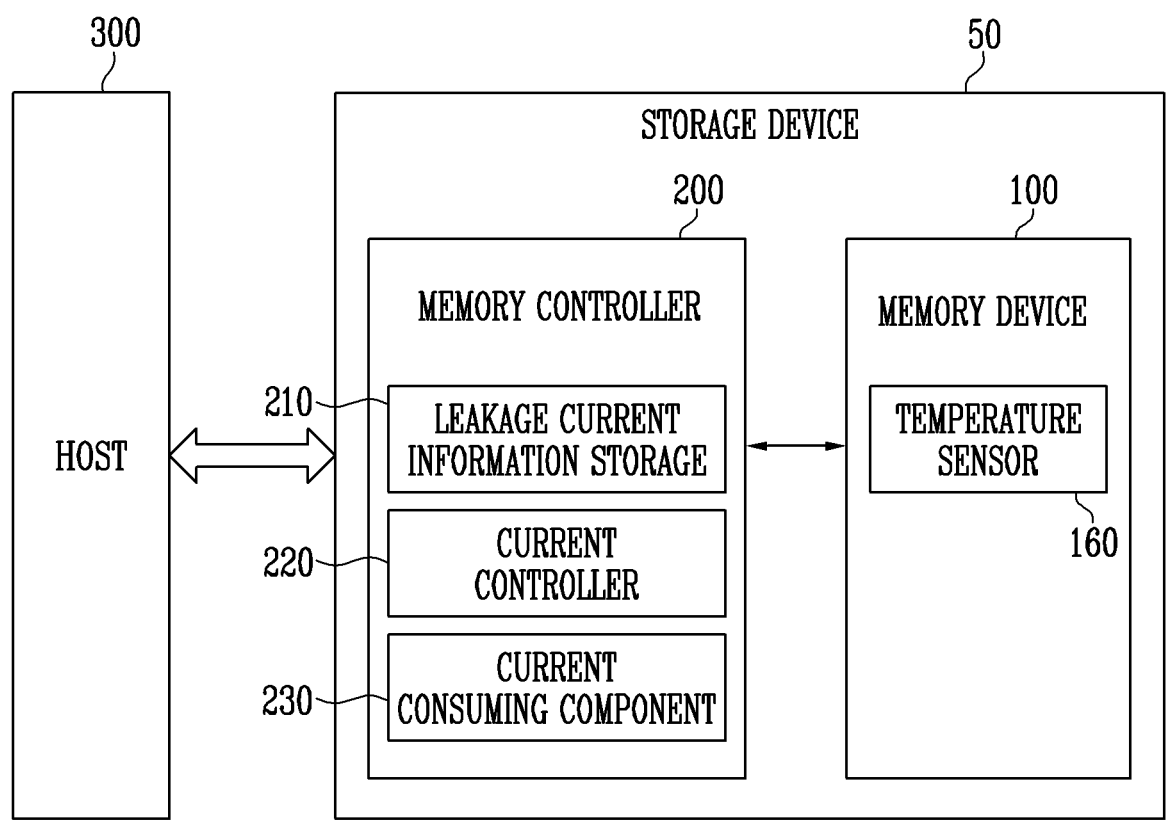
FIG. 1 is a diagram illustrating a storage device in accordance with an embodiment of the present disclosure.

FIG. 1 is a diagram illustrating a storage device 50 in accordance with an embodiment of the present disclosure.

Referring to FIG. 1, the storage device 50 may include a memory device 100 and a memory controller 200 for controlling operations of the memory device 100. The storage device 50 may store data under the control of a host 300, such as a mobile phone, a smart phone, an MP3 player, a laptop computer, a desktop computer, a game console, a TV, a tablet PC or an in-vehicle infotainment.

The storage device 50 may be manufactured as one of various types of storage devices according to a host interface that is a communication scheme with the host 300. For example, the storage device 50 may be configured with one of a variety of types of storage devices, such as a Solid State Drive (SSD), a multimedia card in the form of an MMC, an eMMC, an RS-MMC and a micro-MMC, a secure digital card in the form of an SD, a mini-SD and a micro-SD, a Universal Serial Bus (USB) memory module, a Universal Flash Storage (UFS) device, a personal computer memory card international association (PCMCIA) card type memory module, a peripheral component interconnection (PCI) card type memory module, a PCI express (PCI-E) card type memory module, a Compact Flash (CF) card, a Smart Media Card (SMC), and a memory stick.

The storage device 50 may be manufactured as one of various package types. For example, the storage device 50 may be manufactured as one of various package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 may be operated under the control of the memory controller 200. The memory device 100 may include a memory cell array (not shown) including a plurality of memory cells for storing data.

Each of the memory cells may be configured as a Single Level Cell (SLC) capable of storing one data bit, a Multi-Level Cell (MLC) capable of storing two data bits, a Triple Level Cell (TLC) capable of storing three data bits, or a Quadruple Level Cell (QLC) capable of storing four data bits.

The memory cell array (not shown) may include a plurality of memory blocks. Each memory block may include a plurality of memory cells. One memory block may include a plurality of pages. In an embodiment, the page may be unit for storing data in the memory device 100 or reading data stored in the memory device 100. The memory block may be a unit for erasing data.

In an embodiment, the memory device 100 may be a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory is described.

The memory device 100 may receive a command and an address from the memory controller 200, and access an area in the memory cell array, selected according to the address. The memory device 100 may perform an operation indicated by the command on the area selected according to the address. For example, the memory device 100 may perform a write operation (i.e., a program operation), a read operation, and an erase operation. In the write operation, the memory device 100 may program data in the selected area. In the read operation, the memory device 100 may read data from the selected area. In the erase operation, the memory device 100 may erase data stored in the selected area.

In an embodiment, the memory device 100 may include a temperature sensor 160. The temperature sensor 160 may measure a temperature of the memory device 100. The memory device 100 may provide the memory controller 200 with temperature information corresponding to the temperature of the memory device 100, measured by the temperature sensor 160.

Although a case where the temperature sensor 160 is one component of the memory device 100 is illustrated in FIG. 1, the present disclosure is not limited thereto. For example, the temperature sensor 160 may be located inside the memory controller 200, or be included in the storage device 50 as a separate independent device instead of a component of the memory device 100 or the memory controller 200.

The memory controller 200 may control overall operations of the memory device 100.

When power is applied to the storage device 50, the memory controller 200 may execute firmware (FW). When the memory device 100 is a NAND flash memory, the FW may include a Host Interface Layer (HIL) for controlling communication with the host 300, a Flash Translation Layer (FTL) for controlling communication between the host 300 and the memory device 100, and a Flash Interface Layer (FIL) for controlling communication with the memory device 100.

In an embodiment, the memory controller 200 may receive data and a Logical Block Address (LBA) from the host 300, and translate the LBA into a Physical Block Address (PBA) representing addresses of memory cells included in the memory device 100, in which data is to be stored. In this specification, the LBA and a "logical address" may be used as having the same meaning. In this specification, the PBA and a "physical address" may be used as having the same meaning.

The memory controller 200 may control the memory device 100 to perform a write operation, a read operation, an erase operation, or the like in response to a request from the host 300. In the write operation, the memory controller 200 may provide a write command, a physical block address, and data to the memory device 100. In the read operation, the memory controller 200 may provide a read command and a physical block address to the memory device 100. In the erase operation, the memory controller 200 may provide an erase command and a physical block address to the memory device 100.

In an embodiment, the memory controller 200 may be connected to the memory device 100 through a channel. For example, the memory controller 200 may control the memory device 100 to perform a write operation, a read operation, or an erase operation by providing a command and an address to the memory device 100 through the channel.

In an embodiment, the memory controller 200 may autonomously generate a command, an address, and data regardless of any request from the host 300, and transmit the command, the address, and the data to the memory device 100. For example, the memory controller 200 may provide the memory device 100 with a command, an address, and data, which are used to perform read and write operations accompanied in performing wear leveling, read reclaim, garbage collection, or the like.

In an embodiment, the memory controller 200 may control at least two memory devices 100. The memory controller 200 may control the memory devices according to an interleaving scheme to improve operational performance. The interleaving scheme may be a scheme for controlling operations on at least two memory devices 100 to overlap with each other.

In an embodiment, the memory controller 200 may include a leakage current information storage 210, a current controller 220, and a current consuming component 230.

The leakage current information storage 210 may store information associated with a leakage current generated based on temperature ranges of the memory device 100.

In an embodiment, the information associated with the leakage current may be generated based on the temperature ranges of the memory device 100 and process characteristics of the memory device 100. For example, the information associated with the leakage current may include an amount of a leakage current for each temperature range of the memory device 100, an amount of a leakage current for each process characteristic of the memory device, a maximum allowance of leakage current of the memory device 100, a leakage current margin range, and the like. When at least two memory devices 100 are provided, each memory device 100 may have different process characteristics.

The leakage current margin range may be determined according to a difference between a leakage current generated at a high temperature or a room temperature and a leakage current generated at a low temperature. That is, the leakage current margin range may represent an amount of a current which may be additionally consumed at a low temperature, based on a difference between leakage currents generated according to different temperatures.

In an embodiment, the information associated with the leakage current may be stored in a plurality of memory blocks included in the memory device 100. The current controller 220 may request the memory device 100 of the information associated with the leakage current, and receive the information associated with the leakage current from the memory device 100.

The current controller 220 may control a current such that the current is internally consumed, based on the information associated with the leakage current, according to a current temperature of the memory device 100. For example, when the current temperature of the memory device 100 is equal to or lower than a set temperature, the current controller 220 may control a current such that the current is consumed at the inside of the storage device 50.

In an embodiment, the current controller 220 may control a current within the leakage current margin range.

In an embodiment, the current controller 220 may control the current consuming component 230 or the memory device 100 for the purpose of current consumption. That is, the current controller 220 may perform a heat-generating operation. For example, the current controller 220 may control the current consuming component 230 to flow a current therein. Further, the current controller 220 may control the memory device 100 to consume a current in the memory device 100 by controlling an internal operation or a clock frequency of the memory device 100.

The current consuming component 230 may generate heat by consuming a current.

In an embodiment, the current consuming component 230 may generate heat by using a heat generation action. The current consuming component 230 may include various elements for generating heat through current consumption. For example, the current consuming component 230 may include a resistor.

The host 300 may communicate with the storage device 50, using at least one of various communication standards or interfaces, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Thus, in accordance with the embodiment of the present disclosure, the memory controller 200 controls a current such that the current is consumed at the inside of the storage device 50 within the leakage current margin range, so that heat is generated through current consumption. Accordingly, characteristic degradation of the storage device 50 at a low temperature can be prevented, and a failure can be reduced.

Figure 2:
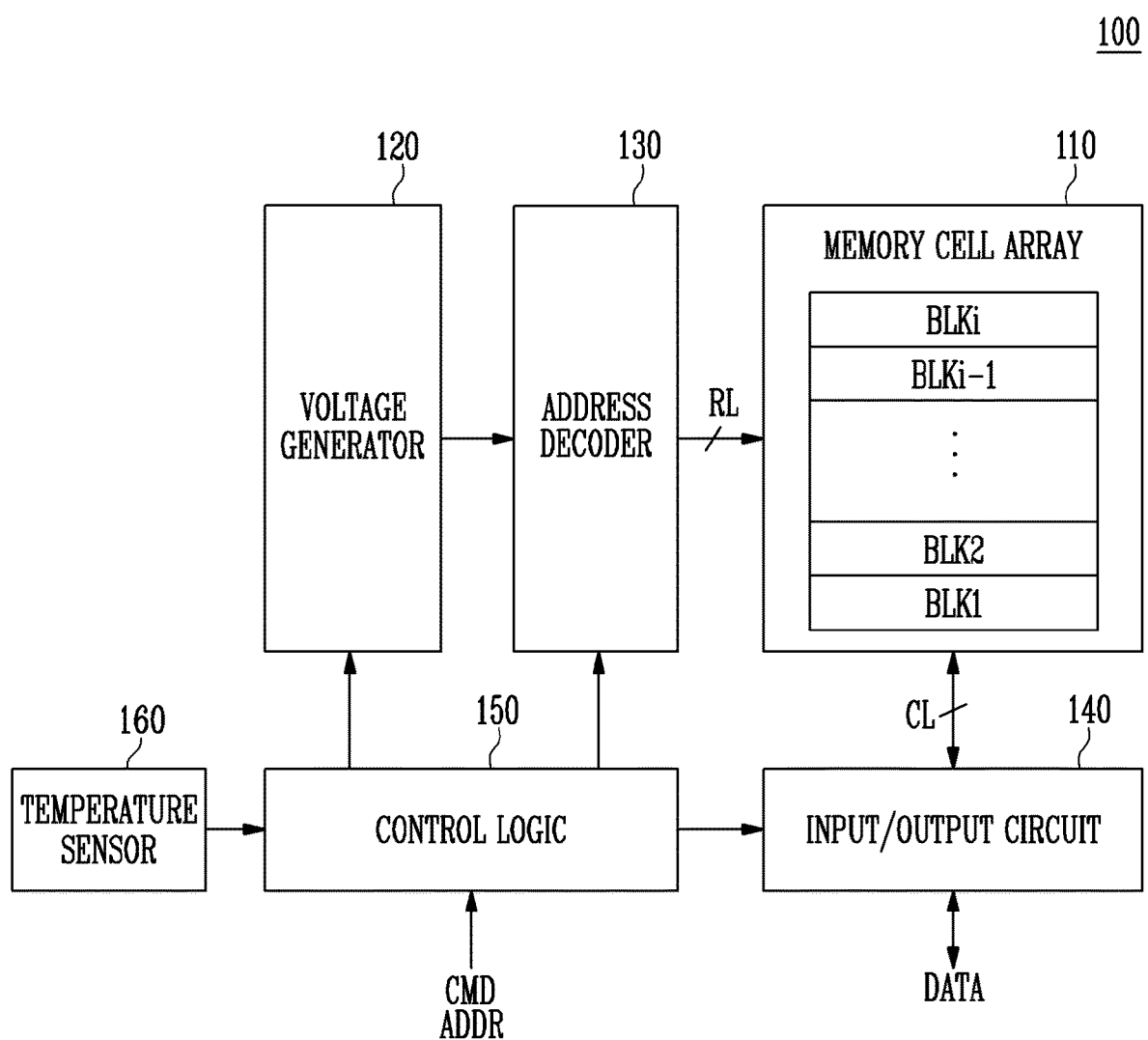
FIG. 2 is a detailed diagram of a memory device shown in FIG. 1.

FIG. 2 is a detailed diagram of the memory device 100 shown in FIG. 1.

Referring to FIG. 2, the memory device 100 may include a memory cell array 110, a voltage generator 120, an address decoder 130, an input/output circuit 140, a control logic 150, and a temperature sensor 160.

The memory cell array 110 may include a plurality of memory blocks BLK1 to BLKi. The plurality of memory blocks BLK1 to BLKi may be connected to the address decoder 130 through row lines RL. The plurality of memory blocks BLK1 to BLKi may be connected to the input/output circuit 140 through column lines CL. In an embodiment, the row lines RL may include word lines, source select lines, and drain select lines. In an embodiment, the column lines CL may include bit lines.

Each of the plurality of memory blocks BLK1 to BLKi may include a plurality of memory cells. In an embodiment, the plurality of memory cells may be nonvolatile memory cells. Memory cells connected to the same word line among the plurality of memory cells may be defined as one physical page. That is, the memory cell array 110 may include a plurality of physical pages. Each of the memory cells of the memory device 100 may be configured as a Single Level Cell (SLC) capable of storing one data bit, a Multi-Level Cell (MLC) capable of storing two data bits, a Triple Level Cell (TLC) capable of storing three data bits, or a Quadruple Level Cell (QLC) capable of storing four data bits.

In an embodiment, the voltage generator 120, the address decoder 130, and the input/output circuit 140 may be referred to as a peripheral circuit. The peripheral circuit may drive the memory cell array 110 under the control of the control logic 150. The peripheral circuit may drive the memory cell array 110 to perform a write operation, a read operation, and an erase operation.

The voltage generator 120 may generate a plurality of operating voltages by using an external power voltage supplied to the memory device 100. The voltage generator 120 may be operated under the control of the control logic 150.

In an embodiment, the voltage generator 120 may generate an internal power voltage by regulating the external power voltage. The internal power voltage generated by the voltage generator 120 may be used as various operating voltages of the memory device 100.

In an embodiment, the voltage generator 120 may generate a plurality of operating voltages by using the external power voltage or the internal power voltage. The voltage generator 120 may generate various voltages used in the memory device 100. For example, the voltage generator 120 may generate a plurality of erase voltages, a plurality of program voltages, a plurality of pass voltages, a plurality of select read voltages, and a plurality of unselect read voltages.

In order to generate a plurality of operating voltages having various voltage levels, the voltage generator 120 may include a plurality of charge pumping capacitors which receive the internal power voltage. The voltage generator 120 may generate the plurality of operating voltages by selectively activating the plurality of charge pumping capacitors under the control of the control logic 150.

The plurality of operating voltages generated by the voltage generator 120 may be supplied to the memory cell array 110 by the address decoder 130.

The address decoder 130 may be connected to the memory cell array 110 through the row lines RL. The address decoder 130 may be operated under the control of the control logic 150. The address decoder 130 may receive an address ADDR from the control logic 150. The address decoder 130 may decode a block address in the received address ADDR. The address decoder 130 may select at least one memory block among the plurality of memory blocks BLK1 to BLKi according to the decoded block address. The address decoder 130 may decode a row address in the received address ADDR. The address decoder 130 may select at least one word line among word lines of the selected memory block according to the decoded row address. In an embodiment, the address decoder 130 may decode a column address in the received address ADDR. The address decoder 130 may connect the input/output circuit 140 to the memory cell array 110 according to the decoded column address.

In accordance with an embodiment of the present disclosure, in a read operation, the address decoder 130 may apply a read voltage to the selected word line, and apply a read pass voltage having a level higher than a level of the read voltage to unselected word lines.

For example, the address decoder 130 may include components such as a row decoder, a column decoder, and an address decoder.

The input/output circuit 140 may include a plurality of page buffers. The plurality of page buffers may be connected to the memory cell array 110 through the bit lines. In a write operation, data may be stored in selected memory cells according to data stored in the plurality of page buffers.

In a read operation, the data stored in the selected memory cells may be sensed through the bit lines, and the sensed data may be stored in the page buffers.

The control logic 150 may control the address decoder 130, the voltage generator 120, and the input/output circuit 140. The control logic 150 may be operated in response to a command CMD transferred from the host 300. The control logic 150 may control the peripheral circuit by generating control signals in response to the command CMD and the address ADDR.

The temperature sensor 160 may measure a temperature of the memory device 100. The temperature sensor 160 may provide the control logic 150 with a temperature signal having different voltage levels corresponding to the measured temperature. The control logic 150 may generate temperature information representing the temperature of the memory device 100. In an embodiment, the temperature sensor 160 is identical to the temperature sensor 160 described with reference to FIG. 1.

FIGS. 3A and 3B are diagrams for describing information associated with a leakage current in accordance with an embodiment of the present disclosure.

Referring to FIG. 3A, the information associated with the leakage current may include information 310 on a leakage current generated according to a temperature and a process characteristic of the memory device 100. Although a case where the process characteristic is a process corner is illustrated in FIG. 3A, the present disclosure is not limited thereto. The process characteristic may include various characteristics associated with a temperature change.

The process corner may represent an extreme process parameter within a range in which the memory device 100 can be normally operated. The process corner may be divided into fast-fast (FF), slow-slow (SS), fast-slow (FS), slow-fast (SF), and typical-typical (TT) according to carrier mobilities of each of an n-channel metal oxide semiconductor field effect transistor (NMOS) and a p-channel metal oxide semiconductor field effect transistor (PMOS).

For example, the process corner may be a condition in which a case where the carrier mobilities of the NMOS and the PMOS are higher by a specific ratio or more than carrier mobilities of the NMOS and the PMOS when the process corner is 'TT' may be set to 'F', and a case where the carrier mobilities of the NMOS and the PMOS are lower by the specific ratio or more than the carrier mobilities of the NMOS and the PMOS when the process corner is 'TT' may be set to 'S'. The ratio may be a predetermined value.

In an embodiment, a leakage current generated in the memory device 100 may vary according to the temperature and the process corner.

In an embodiment, the leakage current may become greater as the temperature of the memory device 100 becomes higher. In FIG. 3A, temperature A is higher than temperature B and the temperature B is higher than temperature C. When the process corner is 'FF', a leakage current LEAK_CURRENT 1 generated according to the temperature A may be greater than a leakage current LEAK_CURRENT 4 generated according to the temperature B, and the leakage current LEAK_CURRENT 4 generated according to the temperature B may be greater than a leakage current LEAK_CURRENT 7 generated according to the temperature C. Further, when the process corner is 'TT', a leakage current LEAK_CURRENT 2 generated according to the temperature A may be greater than a leakage current LEAK_CURRENT 5 generated according to the temperature B, and the leakage current LEAK_CURRENT 5 generated according to the temperature B may be greater than a leakage current LEAK_CURRENT 8 generated according to the temperature C. Further, when the process corner is 'SS', a leakage current LEAK_CURRENT 3 generated according to the temperature A may be greater than a leakage current LEAK_CURRENT 6 generated according to the temperature B, and the leakage current LEAK_CURRENT 6 generated according to the temperature B may be greater than a leakage current LEAK_CURRENT 9 generated according to the temperature C.

In an embodiment, a leakage current for each temperature may be determined according to a process characteristic. Specifically, a leakage current generated at each temperature may be sub-divided according to the process corner. For example, when the temperature of the memory device 100 is the temperature A, the leakage current LEAK_CURRENT 1 generated when the process corner is 'FF' may be greater than the leakage current LEAK_CURRENT 2 generated when the process corner is 'TT', and the leakage current LEAK_CURRENT 2 generated when the process corner is 'TT' may be greater than the leakage current LEAK_CURRENT 3 generated when the process corner is 'SS'. Further, when the temperature of the memory device 100 is the temperature B, the leakage current LEAK_CURRENT 4 generated when the process corner is 'FF' may be greater than the leakage current LEAK_CURRENT 5 generated when the process corner is 'TT', and the leakage current LEAK_CURRENT 5 generated when the process corner is 'TT' may be greater than the leakage current LEAK_CURRENT 6 generated when the process corner is 'SS'. Further, when the temperature of the memory device 100 is the temperature C, the leakage current LEAK_CURRENT 7 generated when the process corner is 'FF' may be greater than the leakage current LEAK_CURRENT 8 generated when the process corner is 'TT', and the leakage current LEAK_CURRENT 8 generated when the process corner is 'TT' may be greater than the leakage current LEAK_CURRENT 9 generated when the process corner is 'SS'.

Meanwhile, although leakage currents according to three kinds of temperatures and three kinds of process corners have been described in FIG. 3A, the present disclosure is not limited thereto. For example, the information associated with the leakage current may include leakage currents generated according to three or more kinds of process corners such as 'FS' and 'SF'.

Referring to FIG. 3B, the information associated with the leakage current may include information 320 on a maximum allowance of leakage current LEAK_CURRENT_MAX and a leakage current margin range R.

The maximum allowance of leakage current LEAK_CURRENT_MAX may represent a maximum value of a leakage current allowed in the memory device 100.

In an embodiment, the current controller 220 may control a current within the leakage current margin range R, when a current temperature of the memory device 100 is equal to or lower than a first temperature (i.e., a reference temperature). The first temperature may be predetermined as a low temperature at which characteristic degradation of the storage device 50 may occur.

The leakage current margin range R may be determined by a difference between the maximum allowance of leakage current LEAK_CURRENT_MAX of the memory device 100 and a leakage current LEAK_CURRENT_LOW generated according to the first temperature, or by a difference between a leakage current LEAK_CURRENT_HIGH generated according to a second temperature and the leakage current LEAK_CURRENT_LOW generated according to the first temperature. The first temperature may be lower than the second temperature. That is, the second temperature may be a predetermined temperature as a high temperature or a room temperature which is relatively higher than the first temperature.

For example, the leakage current margin range R may be predetermined and stored in the leakage current information storage 210. In another example, the leakage current information storage 210 may determine and store the leakage current margin range R, based on the leakage current for each temperature, the leakage current for each process characteristic, the maximum allowance of leakage current LEAK_CURRENT_MAX, and the like.

In an embodiment, the leakage current margin range R may be determined by a difference between a leakage current having a small magnitude, which is selected from the maximum allowance of leakage current LEAK_CURRENT_ MAX and the leakage current LEAK_CURRENT_HIGH generated according to the second temperature, and the leakage current generated according to the first temperature.

In an embodiment, when the maximum allowance of leakage current LEAK_CURRENT_MAX is greater than the leakage current LEAK_CURRENT_HIGH generated according to the second temperature, the leakage current margin range R may be determined by a difference between the leakage current LEAK_CURRENT_HIGH generated according to the second temperature and the leakage current LEAK_CURRENT_LOW generated according to the first temperature. For example, when the maximum allowance of leakage current LEAK_CURRENT_MAX is 15 mA, and the leakage current LEAK_CURRENT_HIGH generated according to the second temperature is 10 mA, the leakage current margin range R may be determined by a difference between the leakage current LEAK_CURRENT_HIGH generated according to the second temperature and the leakage current LEAK_CURRENT_LOW generated according to the first temperature. In the leakage current margin range R, 0 mA is formed as a minimum value, and the difference between the leakage current LEAK_CURRENT_HIGH generated according to the second temperature and the leakage current LEAK_CURRENT_LOW generated according to the first temperature is formed as a maximum value.

In an embodiment, when the maximum allowance of leakage current LEAK_CURRENT_MAX is less than or equal to the leakage current LEAK_CURRENT_HIGH generated according to the second temperature, the leakage current margin range R may be determined by a difference between the maximum allowance of leakage current LEAK_CURRENT_MAX and the leakage current LEAK_CURRENT_LOW generated according to the first temperature. For example, when the maximum allowance of leakage current LEAK_CURRENT_MAX is 15 mA, and the leakage current LEAK_CURRENT_HIGH generated according to the second temperature is 20 mA, the leakage current margin range R may be determined by the difference between the maximum allowance of leakage current LEAK_CURRENT_MAX and leakage current LEAK_CURRENT_LOW generated according to the first temperature. In the leakage current margin range R, 0 mA is formed as a minimum value, and the difference between the maximum allowance of leakage current LEAK_CURRENT_MAX and the leakage current LEAK_CURRENT_LOW generated according to the first temperature is formed as a maximum value.

Figure 4:
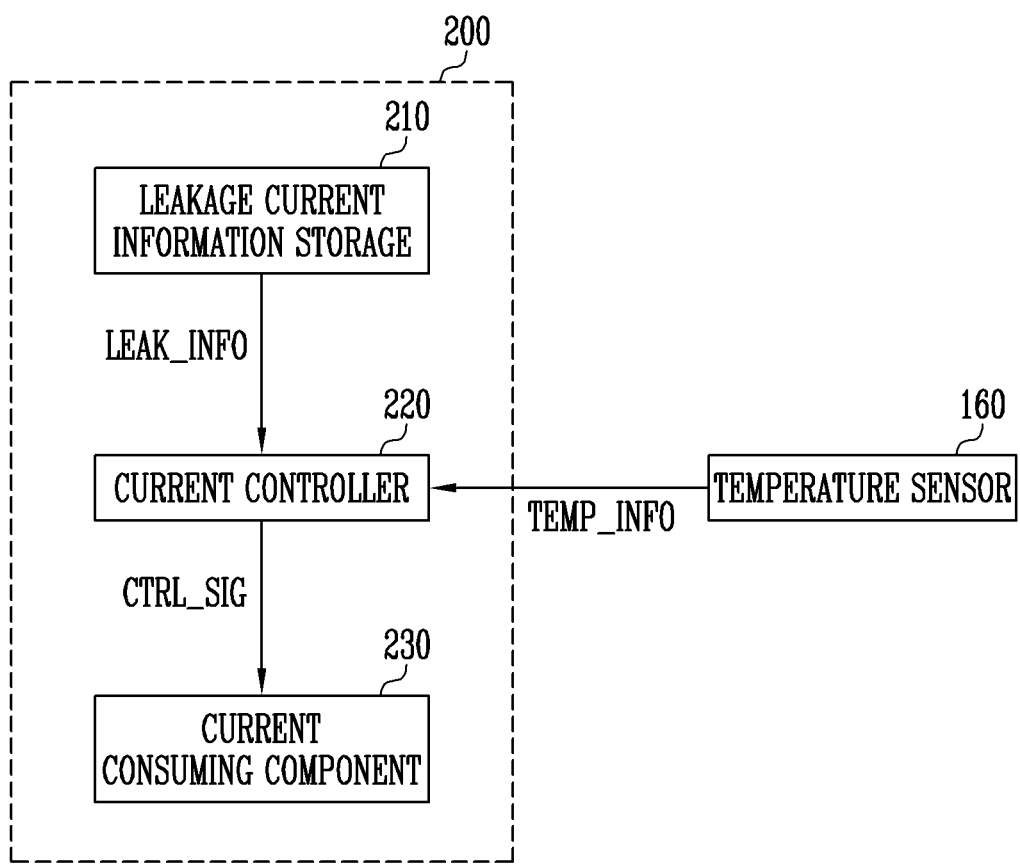
FIG. 4 is a diagram illustrating an example of controlling a current such that the current is consumed at the inside of a memory controller in accordance with an embodiment of the present disclosure.

FIG. 4 is a diagram illustrating an example of controlling a current such that the current is consumed at the inside of the memory controller 200 in accordance with an embodiment of the present disclosure.

FIG. 4 shows an example of consuming a current through the current consuming component 230. In an embodiment, the current consuming component 230 may exist at a position adjacent to the memory device 100.

Referring to FIG. 4, the current controller 220 may receive temperature information TEMP_INFO including a current temperature from the temperature sensor 160. The current controller 220 may determine whether a current is to be consumed at the inside, based on the temperature information TEMP_INFO. For example, when the current temperature is equal to or lower than the first temperature, the current controller 220 may control the current such that the current is consumed at the inside. The first temperature may be predetermined as a low temperature at which characteristic degradation of the storage device 50 may occur.

The current controller 220 may further receive information LEAK_INFO associated with a leakage current from the leakage current information storage 210. The current controller 220 may control a current based on the information LEAK_INFO.

For example, the current controller 220 may control a current such that the current flows in the current consuming component 230 within the leakage current margin range R. Specifically, the current controller 220 may transmit a control signal CTRL_SIG to the current consuming component 230, and the current consuming component 230 may consume the current in response to the control signal CTRL_SIG. The current flowing in the current consuming component 230 may be within the leakage current margin range R. The current consuming component 230 may generate heat through current consumption, and the temperature of the memory device 100 may increase.

In an embodiment, as the current temperature becomes higher, the current controller 220 may decrease an amount of current consumed at the inside by controlling the current. On the contrary, as the current temperature becomes lower, the current controller 220 may increase the amount of current consumed at the inside by controlling the current. As described above with reference to FIGS. 3A and 3B, the leakage current increases as the temperature of the memory device 100 becomes higher, and the leakage current margin range R may become narrower as the leakage current increases. Therefore, the current controller 220 may control the current such that the amount of current consumed through the current consuming component 230 is decreased as the current temperature becomes higher. On the contrary, the current controller 220 may control the current such that the amount of current consumed through the current consuming component 230 is increased as the current temperature becomes lower.

In an embodiment, the current controller 220 may control the current until the current temperature reaches a predetermined target temperature. The predetermined target temperature may be higher than the first temperature and be lower than the second temperature.

Figure 5:
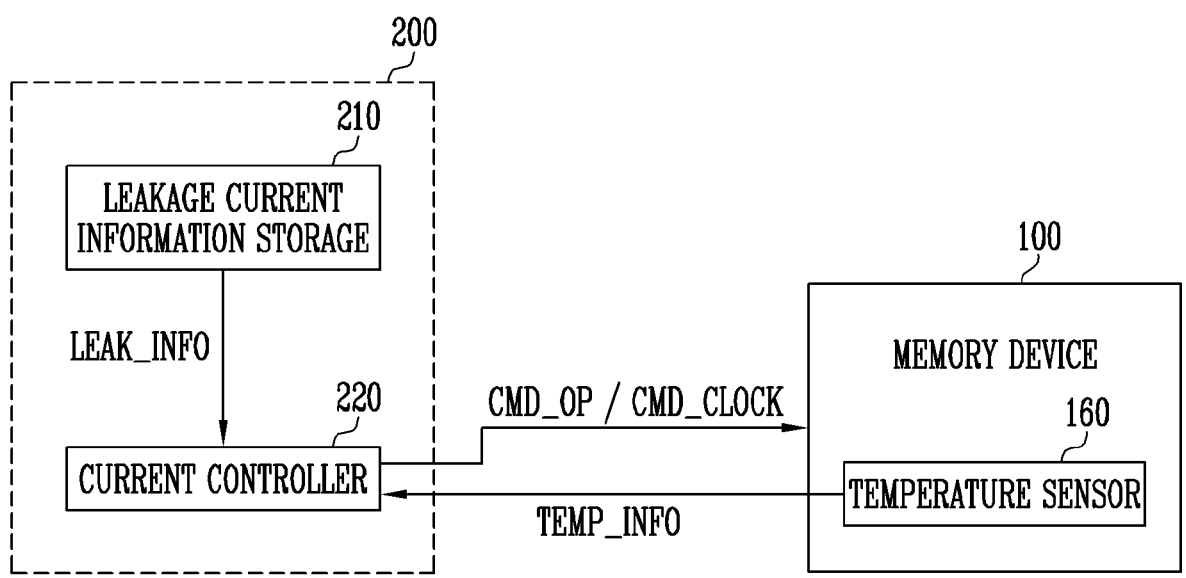
FIG. 5 is a diagram illustrating another example of controlling a current such that the current is consumed at the inside of the memory device in accordance with an embodiment of the present disclosure.

FIG. 5 is a diagram illustrating another example of controlling a current such that the current is consumed at the inside of the memory device 100 in accordance with an embodiment of the present disclosure.

FIG. 5 shows an example of consuming a current through the memory device 100.

Referring to FIG. 5, the current controller 220 may receive temperature information TEMP_INFO including a current temperature from the temperature sensor 160. The current controller 220 may determine whether a current is to be consumed at the inside of the memory device 100, based on the temperature information TEMP_INFO. For example, when the current temperature is equal to or lower than the first temperature, the current controller 220 may control the current such that the current is consumed at the inside. The first temperature may be predetermined as a low temperature at which characteristic degradation of the storage device 50 may occur.

The current controller 220 may receive information LEAK_INFO associated with a leakage current from the leakage current information storage 210. The current controller 220 may control a current based on the information LEAK_INFO.

In an embodiment, the current controller 220 may control a current such that an internal operation of the memory device 100 is performed within the leakage current margin range R. The internal operation may include a dummy operation such as a status information read operation of the memory device 100 or a parameter information read operation. For example, the current controller 220 may control the memory device 100 such that the current is consumed according to the internal operation of the memory controller 100. Specifically, the current controller 220 may transmit a command CMD_OP instructing the internal operation to the memory device 100. The current consumed according to the internal operation of the memory device 100 may belong to the leakage current margin range R. Heat may be generated through the current consumed according to the internal operation of the memory device 100, and the temperature of the memory device 100 may increase. In addition, when the storage device 50 is manufactured in a package form, the temperature may further increase due to heat generation between memory devices.

In an embodiment, the current controller 220 may control a clock frequency of the memory device 100 within a range allowed by the leakage current margin range R. For example, the current controller 220 may increase the clock frequency of the memory device 100, thereby increasing an amount of current consumed at the inside. Specifically, the current controller 220 may transmit a command CMD_CLOCK for controlling the clock frequency to the memory device 100. A fluctuation width of the clock frequency may be determined according to the leakage current margin range R. When the clock frequency of the memory device 100 increases, the current consumed in the memory device 100 may increase due to an increase in operating speed. Accordingly, the temperature of the memory device 100 may increase.

In an embodiment, the current controller 220 may control current such that, as the current temperature becomes higher, the amount of current consumed according to the internal operation of the memory device 100 or under the control of the clock frequency decreases. On the contrary, the current controller 220 may control the current such that, as the current temperature becomes lower, the amount of current consumed according to the internal operation of the memory device 100 or under the control of the clock frequency increases.

Figure 6:
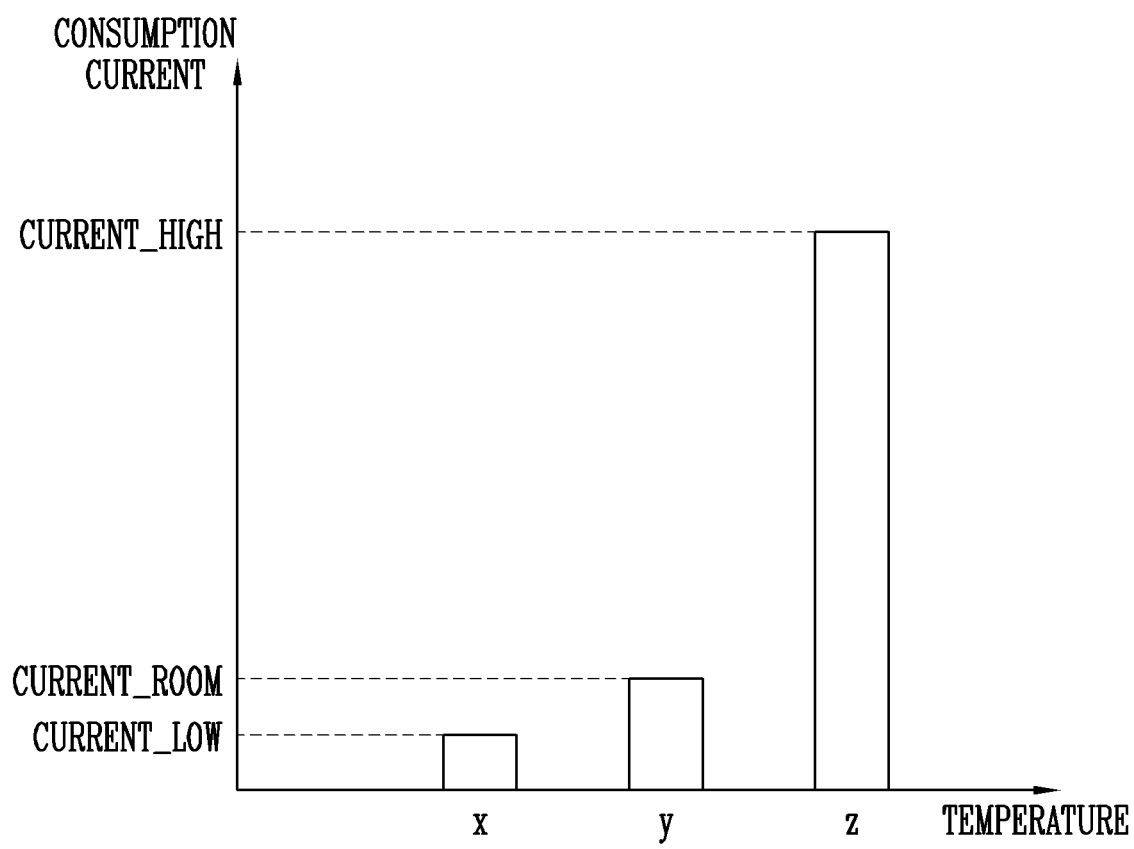
FIG. 6 is a graph illustrating a temperature change according to a current consumption amount in accordance with an embodiment of the present disclosure.

FIG. 6 is a graph illustrating a temperature change according to a current consumption amount in accordance with an embodiment of the present disclosure. In FIG. 6, the horizontal axis represents temperatures of the memory device 100, and the vertical axis represents consumption currents at the inside.

Referring to FIG. 6, a current temperature of the memory device 100 is temperature x which is lowest, and a leakage current CURRENT_LOW with respect to a low temperature is generated.

When a current corresponding to a leakage current CURRENT_ROOM with respect to a room temperature is consumed at the inside, the temperature of the memory device 100 may be increased to temperature y higher than the temperature x.

In addition, when a current corresponding to a leakage current CURRENT_HIGH with respect to a high temperature is consumed at the inside, the temperature of the memory device 100 may be increased to temperature z higher than the temperature y.

Thus, in accordance with the embodiment of the present disclosure, a leakage current margin range determined by a difference between leakage current generated according to different temperatures is stored, and a current is additionally consumed at the inside of the storage device 50 according to the leakage current margin range, so that the temperature of the memory device 50 can become high. Accordingly, characteristic degradation of the storage device 50 at a low temperature can be prevented, and a failure rate can be reduced.

Figure 7:
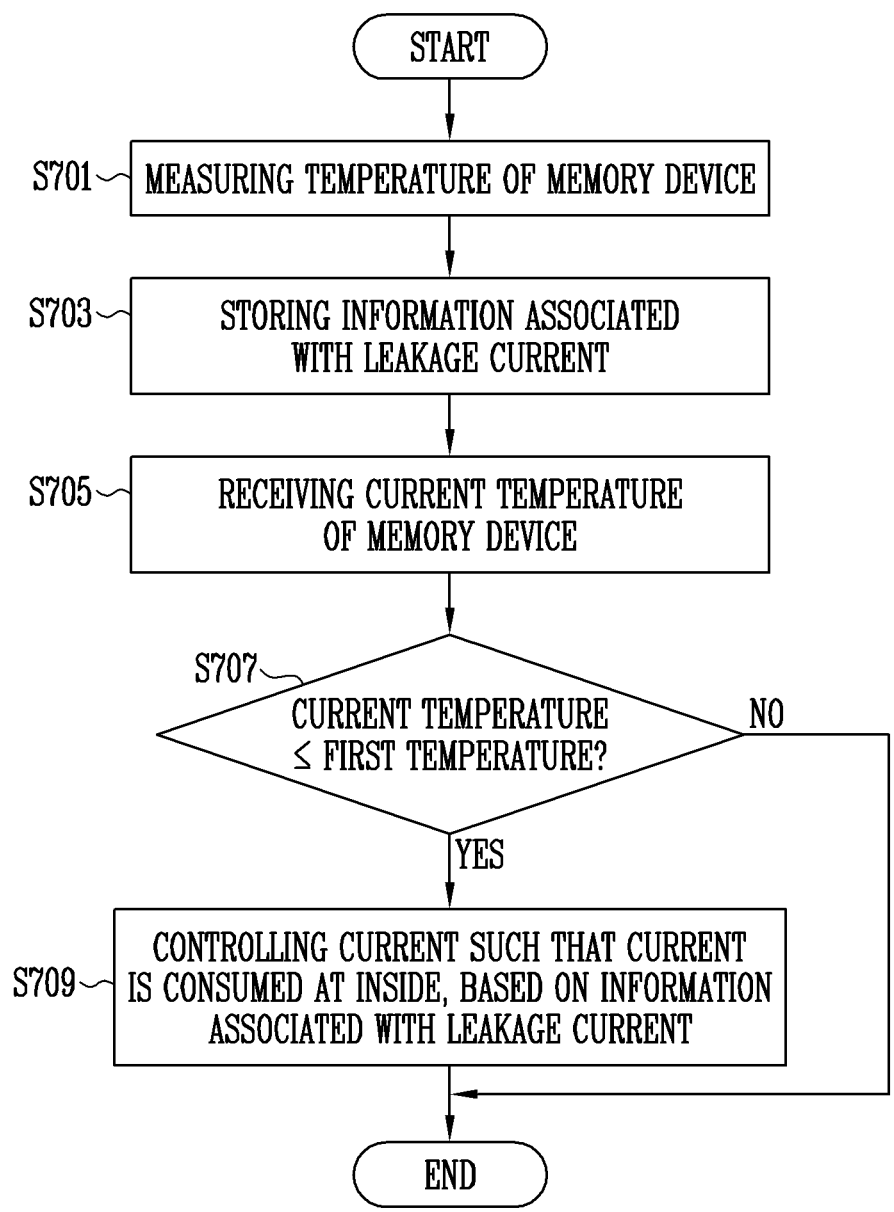
FIG. 7 is a flowchart for describing an operating method of a storage device in accordance with an embodiment of the present disclosure.

FIG. 7 is a flowchart for describing an operating method of a storage device in accordance with an embodiment of the present disclosure.

The procedure shown in FIG. 7 may be performed by, for example, the memory controller 200 shown in FIG. 1.

Referring to FIG. 7, in operation S701, the memory controller 200 may measure a temperature of the memory device 100.

In operation S703, the memory controller 200 may store information associated with a leakage current generated according to the temperature of the memory device 100.

In operation S705, the memory controller 200 may receive a current temperature of the memory device 100 from the memory device 100.

In operation S707, the memory controller 200 may determine whether the current temperature is equal to or lower than a first temperature. When the current temperature is equal to or lower than the first temperature, based on a determination result in the operation S707, the memory controller 200 may perform operation S709.

In the operation S709, the memory controller 200 may control a current such that the current is internally consumed, based on the information associated with the leakage current. The amount of the consumed current may be adjusted according to a change in the current temperature.

When the current temperature is higher than the first temperature as the determination result in the operation S707, the memory control 200 may end the procedure.

Figure 8:
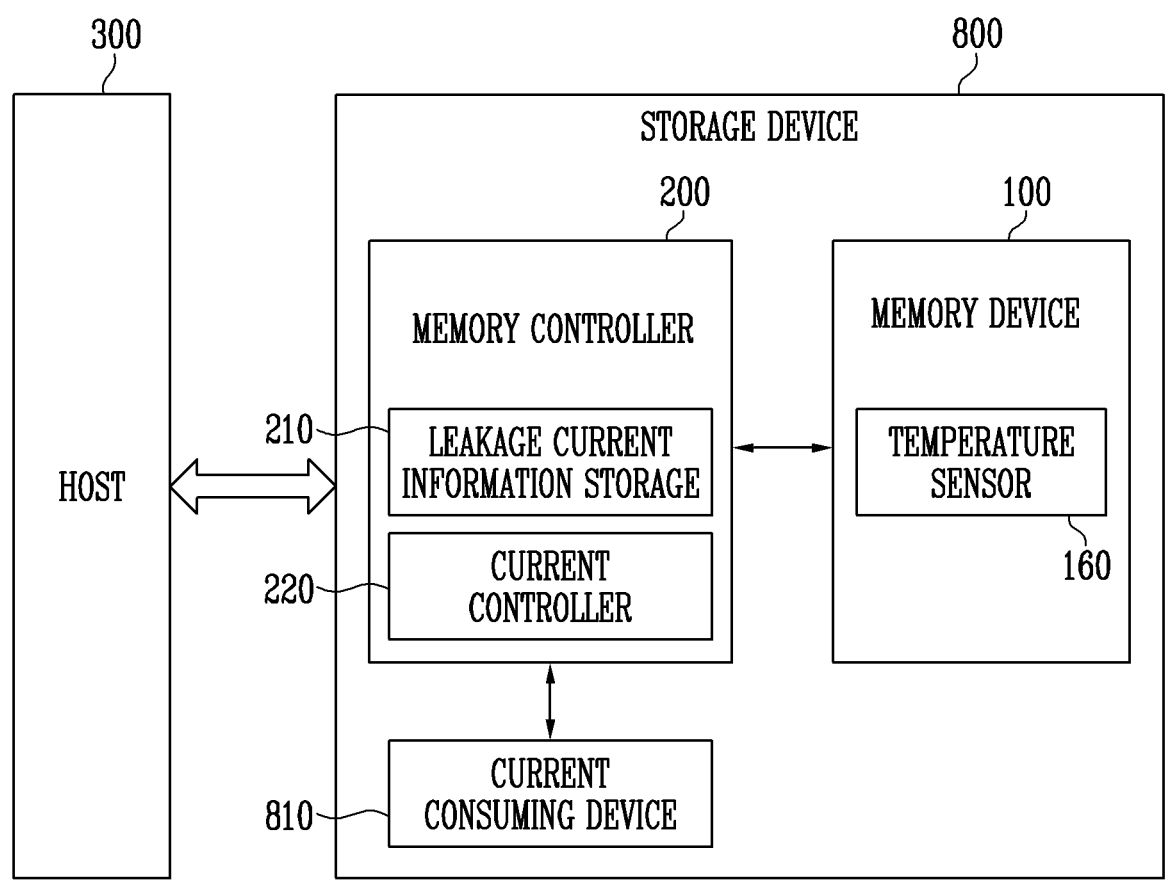
FIG. 8 is a diagram illustrating another example of a storage device in accordance with an embodiment of the present disclosure.

FIG. 8 is a diagram illustrating another example of a storage device in accordance with an embodiment of the present disclosure.

In FIG. 8, a temperature sensor 160, a leakage current information storage 210, and a current controller 220 may be identical to the temperature sensor 160, the leakage current information storage 210, and the current controller 220, which are shown in FIG. 1.

Referring to FIGS. 1 and 8, a storage device 800 shown in FIG. 8 is different from the storage device 50 shown in FIG. 1, in that the current consuming component 230 existing at the inside of the memory controller 200 is replaced with a current consuming device 810 at the outside of the memory controller 200. That is, in some embodiments, the current consuming device 810 may exist as a separate independent device connected through a channel instead of one component of the memory controller 200. Descriptions of the above-described current consuming component 230 may be equally applied to the current consuming device 810. Thus, the memory controller 200 may transfer a control signal to the current consuming device 810, thereby controlling a current to flow in the current consuming device 810.

Figure 9:
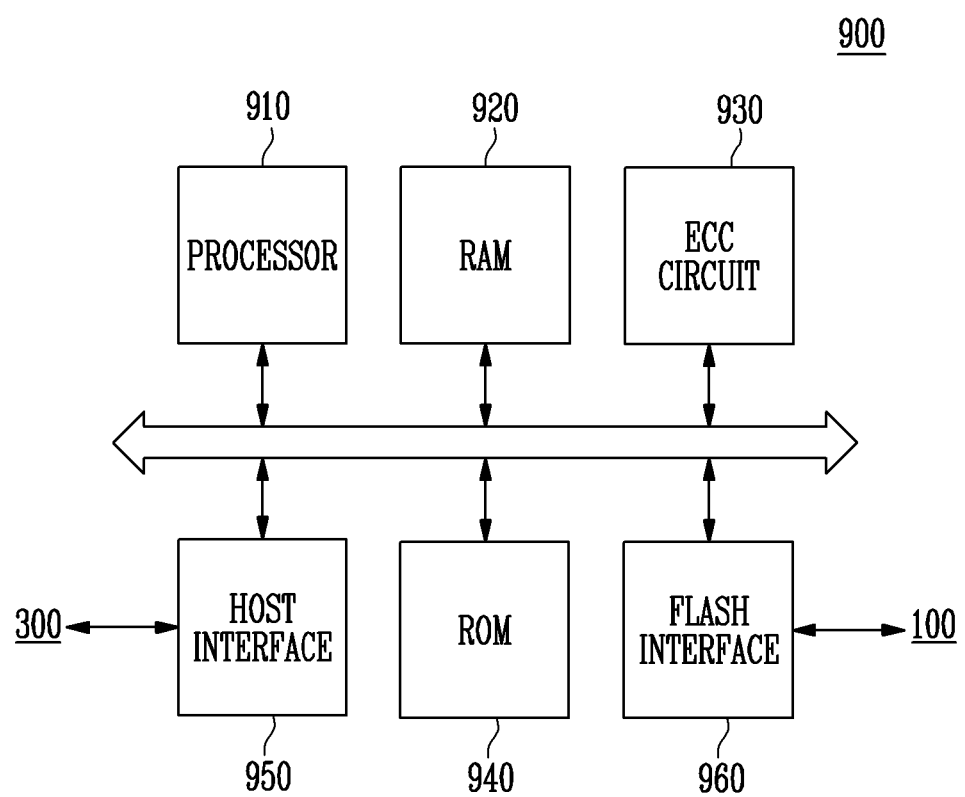
FIG. 9 is a diagram illustrating another embodiment of a memory controller shown in FIG. 1.

FIG. 9 is a diagram illustrating another embodiment of the memory controller shown in FIG. 1.

Referring to FIGS. 1 and 9, a memory controller 900 may include a processor 910, a RAM 920, an Error Correction Code (ECC) circuit 930, a ROM 940, a host interface 950, and a flash interface 960.

The processor 910 may control an overall operation of the memory controller 900. In an embodiment, the current controller 220 and the current consuming component 230, which are shown in FIG. 1, may be implemented as one component of the processor 910. Therefore, the processor 910 may equally perform operations of the current controller 220 and the current consuming component 230, which are described with reference to FIG. 1.

For example, when a current temperature of the memory device 100 is equal to or lower than a set temperature, the processor 910 may control a current such that the current is consumed at the inside, based on information associated with a leakage current. The processor 910 may control the current consuming component 230 or the memory device 100 within a leakage current margin range, thereby allowing the current to be consumed.

Accordingly, the processor 910 may generate heat through current consumption, thereby increasing the temperature of the memory device 100.

The RAM 920 may be used as a buffer memory, a cache memory, a working memory, or the like of the memory controller 900.

The ECC circuit 930 may perform error correction. The ECC circuit 930 may perform ECC encoding, based on data written in the memory device 100 through the flash interface 960. The ECC-encoded data may be transferred to the memory device 100 through the flash interface 930. The ECC circuit 930 may perform ECC decoding on data received from the memory device 100 through the flash interface 960. For example, the ECC circuit 930 may be included in the flash interface 960 as a component thereof.

The ROM 940 may store, in a firmware form, various information required when the memory controller 900 is operated. In an embodiment, the leakage current information storage 210 shown in FIG. 1 may be implemented as one component of the ROM 940. Therefore, the ROM 940 may store information associated with a leakage current.

The memory controller 900 may communicate with an external device (e.g., the host 300, an application processor, or the like) through the host interface 950.

The memory controller 900 may communicate with the memory device 100 through the flash interface 960. The memory controller 900 may transmit a command, an address, a control signal, and the like to the memory device 100 through the flash interface 960, and receive data. For example, the flash interface 960 may include a NAND interface.

In accordance with the present disclosure, there can be provided a storage device and an operating method thereof, which can prevent characteristic degradation of the storage device at a low temperature and reduce a failure.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all operations may be selectively performed or part of the operations may be omitted. In each embodiment, the operations are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Moreover, the embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein and the following claims. Furthermore, the embodiments can be combined to form additional embodiments.

What is claimed is:

1. A storage device comprising:
    a memory device;
    a leakage current information storage configured to store information associated with a leakage current generated based on a temperature range of the memory device; and
    a current controller configured to increase an amount of a current internally consumed, based on the information associated with the leakage current, when a current temperature of the memory device is equal to or lower than a first temperature.

2. The storage device of claim 1, wherein the information associated with the leakage current includes a leakage current margin range determined by a difference between a maximum allowance of leakage current of the memory device and a leakage current generated according to the first temperature, or by a difference between a leakage current generated according to a second temperature of the memory device and the leakage current generated according to the first temperature.

3. The storage device of claim 2, wherein the leakage current generated according to the first temperature and the leakage current generated according to the second temperature are further determined according to a process characteristic of the memory device.

4. The storage device of claim 2, wherein the first temperature is lower than the second temperature.

5. The storage device of claim 2, wherein the current controller controls the amount of the current within the leakage current margin range.

6. The storage device of claim 1, wherein the current controller decreases the amount of the current internally consumed by controlling the current as the current temperature becomes higher.

7. The storage device of claim 1, further comprising a current consuming component configured to generate heating by consuming the current.

8. The storage device of claim 7, wherein the current controller controls the current consuming component to flow the current in the current consuming component.

9. The storage device of claim 1, wherein the current controller controls the memory device to consume the current according to an internal operation of the memory device.

10. The storage device of claim 1, wherein the current controller increases the amount of the current internally consumed by increasing a clock frequency of the memory device.

11. A method of operating a storage device including a memory controller and a memory device, the method comprising:
    measuring, by the memory controller, a current temperature of the memory device;
    determining, by the memory controller, a leakage current margin range based on an amount of a leakage current for each temperature range of the memory device; and
    increasing, by the memory controller, an amount of a current to be internally consumed within the leakage current margin range.

12. The method of claim 11, wherein, in the determining of the leakage current margin range, the leakage current margin range is determined by a difference between a leakage current generated according to a first temperature of the memory device and a leakage current generated according to a second temperature higher than the first temperature.

13. The method of claim 11, wherein, in the determining of the leakage current margin range, the leakage current margin range is determined by a difference between a leakage current generated according to a first temperature of the memory device and a maximum allowance of leakage current of the memory device.

14. The method of claim 11, wherein the leakage current for each temperature range is further determined according to a process characteristic of the memory device.

15. The method of claim 11, wherein the increasing of the amount of the current to be internally consumed is performed according to whether the current temperature of the memory device is equal to or lower than a first temperature.

16. The method of claim 11, wherein, in the increasing of the amount of the current to be internally consumed, the amount of the consumed current is adjusted according to the current temperature of the memory device.

17. A storage device comprising:
    a memory device;
    a current consuming component configured to generate heat by consuming a current; and
    a current controller configured to increase an amount of the current flowing in the current consuming component until a current temperature of the memory device reaches a predetermined target temperature by the generated heat, when the current temperature is equal to or lower than a first temperature,
    wherein the predetermined target temperature is higher than the first temperature.

18. The storage device of claim 17, wherein the current controller increases the amount of the current within a leakage current margin range which is determined based on a temperature and a process characteristic of the memory device.

* * * * *